(12) United States Patent
Wang

(10) Patent No.: US 6,295,123 B1
(45) Date of Patent: Sep. 25, 2001

(54) MULTIPLE PHOTON ABSORPTION FOR HIGH RESOLUTION LITHOGRAPHY

(75) Inventor: Chun-Ming Wang, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/689,931

(22) Filed: Oct. 13, 2000

(51) Int. Cl.[7] .............. G03B 27/72; G03B 27/42; G03B 27/54; F21V 9/16; G03C 5/00
(52) U.S. Cl. ............... 355/71; 355/53; 355/54; 355/67; 355/77; 250/458.1; 250/492.2; 250/492.21; 250/492.23; 250/503.1; 430/311; 430/312; 430/313
(58) Field of Search ................. 355/53, 54, 67, 355/71, 77; 250/458.1, 492.2, 492.21, 492.23, 503.1; 430/311, 312, 313

(56) References Cited

U.S. PATENT DOCUMENTS

| | | | |
|---|---|---|---|
| 3,949,319 | 4/1976 | Tofield et al. | 331/94.5 F |
| 5,034,613 | 7/1991 | Denk et al. | 250/458.1 |
| 5,637,966 | 6/1997 | Umstadter et al. | 315/507 |
| 5,680,018 | 10/1997 | Yamada | 315/500 |
| 5,739,898 | * 4/1998 | Ozawa et al. | 355/53 |
| 5,866,911 | * 2/1999 | Baer | 250/458.1 |
| 5,952,668 | * 9/1999 | Baer | 250/492.2 |

* cited by examiner

Primary Examiner—Russell Adams
Assistant Examiner—Khaled Brown
(74) Attorney, Agent, or Firm—George O. Saile; Stephen B. Ackerman

(57) ABSTRACT

Conventional optical lithography has a lower limit of about 180 nm because the projection system is opaque to radiation of wavelength shorter than this. This limitation has been overcome by using, in a standard photoreduction system, light in the form of a train of short duration high intensity pulses. Because of two-photon interactions, light having half the wavelength of the illuminating radiation is then generated in the focal plane. There are thus two aerial images present while the photoresist is being exposed. One is the conventional long wavelength image and its associated CD while the other is the short wavelength image with its smaller CD. Since the resist is sensitive to only the shorter wavelength, only the lower CD image remains after development.

17 Claims, 1 Drawing Sheet

MULTIPLE PHOTON ABSORPTION FOR HIGH RESOLUTION LITHOGRAPHY

FIELD OF THE INVENTION

The invention relates to the general field of photolithography with particular reference to improving system resolution.

BACKGROUND OF THE INVENTION

Increases in the density of components that can be placed on a semiconductor chip has been largely due to advances in photolithography. This has been associated with using radiation of ever decreasing wavelengths. As long as the minimum size (critical dimension or CD) of the components was greater than the wavelength of the radiation being used to expose the photoresist, advances in the art did not require any changes in the masks and optical systems used other than to reduce the sizes of the components.

When the critical dimension got to be less than about half the wavelength of the radiation being used radiation of lower wavelength had to be substituted. Eventually, critical dimensions reached, and then went below, the lower limit of optical lithography where conventional optics and resists can still be used.

When the wavelength of the imaging radiation gets to be less than the CD, the effects of diffraction, though always present, become prominent enough to introduce noticeable distortions into the projected images relative to their original shapes on the reticle. These distortions are particularly sensitive to the distances between the various features in the pattern and are therefore referred to as 'proximity effects'. An entire branch of photolithography has been devoted to finding effective ways to deal with this problem. Among the solutions that have been adopted we may mention the use of serifs to compensate for the distortions, scattering bars that reduce the effective separation between lines without themselves appearing in the image, and phase shift masks that alter the optical path length near diffracting edges.

Although the above-noted solutions have been applied with some success, this success has been limited. Additionally, these techniques are time consuming as well as expensive and, in general, quite pattern dependent. There is thus a strong incentive to find ways to form images using radiation of shorter wavelength. Although it has been demonstrated that X-ray lithography is capable of producing patterns whose CD is one or two orders of magnitude less those obtainable with the best optical lithography, its cost remains unattractive at this time.

No matter how effective the above-mentioned compensation techniques, conventional optical lithography cannot be used below about 180 nm because the optical system becomes opaque to the radiation. The present invention shows how this limitation may be overcome by using two-photon absorption which we shall now discuss.

Harmonic light generation, or frequency doubling, has been known for a number of years. The basic principle is that when a suitable medium is irradiated with light of a given frequency most of the photons are absorbed, each such absorption causing an electron to be raised to a first energy level, and then re-emitted by spontaneous emission as the electron returns to its ground state. If the light intensity is sufficiently high, a second photon may be absorbed before spontaneous emission occurs, causing the electron to be raised to a new level whose energy is twice that of the first energy level. When this electron returns to the ground state, a photon having twice the frequency of the incoming radiation is emitted.

Although frequency doubling is, in principle, possible with any light source, given a suitable medium, in practice the necessary intensity is difficult to achieve with any sources other than lasers. It has also been found that the probability of frequency doubling can be significantly increased if the incoming radiation is in the form of very short but very intense pulses that arrive at high repetition rate. The high repetition rate increases the probability of a photon arriving at any given atom while the latter is still in an excited state while the high intensity of the pulse increases the number of photons per pulse. Furthermore, since the pulses are very narrow, the duty ratio remains relatively low, even at the high repetition rates, so that the overall power level of the incoming radiation can be quite low.

Although frequency doubling has been most widely observed in crystalline materials having suitable band structures, it can also occur in liquid or amorphous media provided they include a dye which is known to absorb the incoming radiation.

A routine search of the prior art was performed. References of interest that were found were U.S. Pat. No. 3,949,319 (Tofield) who shows a laser using multiple photon absorption. In U.S. Pat. No. 5,680,018, Yamada shows a method to generate a laser beam using multiple photon adsorption. Umstadter et al. in U.S. Pat. No. 5,637,966 shows a pulsed laser that is used to generates a plasma while Denk et al. in U.S. Pat. No. 5,034,613 describe two-photon laser microscopy.

SUMMARY OF THE INVENTION

It has been an object of the present invention to provide a process for photolithography having higher resolution than that obtained with conventional 193 nm processes.

Another object of the invention has been that said process be fully compatible with conventional optical systems.

A further object has been to provide a light source that is compatible with said process.

A still further object has been to provide a form of photoresist that is compatible with said process.

These objects have been achieved by using a standard photoreduction system that is illuminated by means of a train of short duration high intensity light pulses. As a result of the two-photon process, light having half the wavelength of the illuminating radiation is generated in the focal plane. There are thus two aerial images present within the resist. One is the conventional long wavelength image and its associated CD while the other is the short wavelength image and its associated, and smaller, CD. By making the resist sensitive to only the shorter wavelength, only the lower CD image remains after development.

DESCRIPTION OF THE PREFERRED EMBODIMENTS

Figure 1:
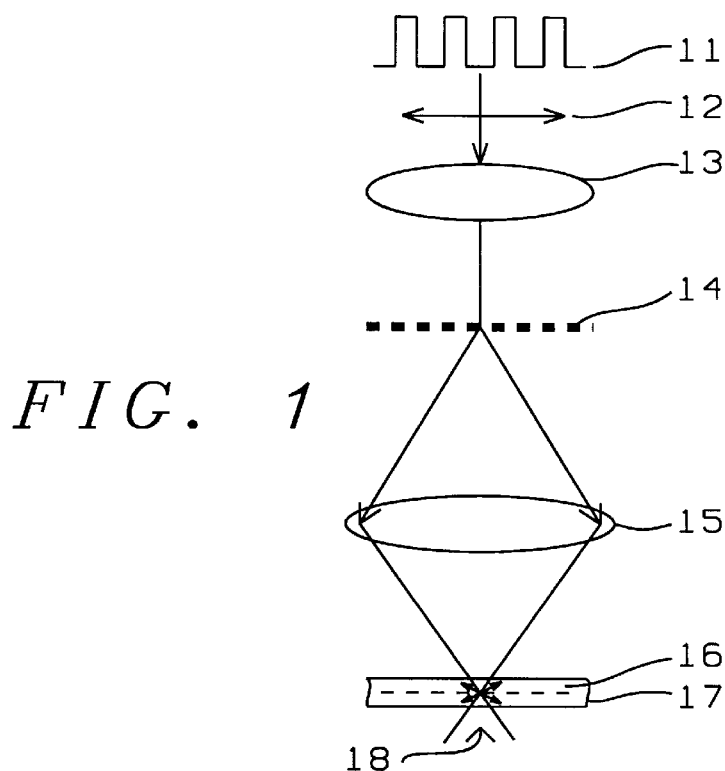
FIG. 1 is a schematic representation of the photoreduction system.

As already noted, optical systems become unusable for wavelengths below about 180 nm. Therefore, the present invention assumes a conventional photoreduction system that uses light of a wavelength greater than 180 nm. An example of a suitable light source is a KrF ultra short pulsed laser (wavelength 248 nm).

Typically, the wavelength of the illuminating radiation will be between about 248 and 365 nm, but whatever the wavelength of the selected light source, it is a key feature of the present invention that the photoresist material that is used with the system be insensitive to radiation of this wavelength while at the same time being sensitive to radiation having half this wavelength. By 'sensitive' we mean that during exposure to the radiation the resist material either polymerizes or depolymerizes (negative or positive resist respectively) while non-irradiated areas remain unchanged.

As a matter of routine the photoresist will be presented to the system in the form of a thin layer on a substrate (most commonly a silicon wafer) that is disposed so that the focal plane of the photoreduction system is parallel to, and wholly within, the photoresist layer. An example of photoresist that is suitable for use with the present invention is Sumitomo PAR 700.

Once the system is ready to operate, the selected light source is used to illuminate the reticle. This is accomplished, as discussed earlier, by causing the light source to emit a series of pulses which are then scanned, raster fashion, over the reticle. Each pulse has a width that is no greater than about 0.2 picoseconds, a power level of no less than about 5 watts, a repetition rate of between about $10^3$ and $10^8$ pulses per second, and an average power level that is no greater than about 50 watts.

Modification of the light source to emit the desired series of light pulses can be accomplished by means of Q-switching wherein a shutter in time mode is used to control pulses or by means of a saturation absorber wherein an aperture selectively passes single mode pulses while blocking multi-mode pulses. This can be arranged because the single-mode pulses have a smaller dimension and pulse width than multi-mode pulses.

Provided the pulse rate, pulse power, etc. are within the above-specified limits, between about 5 and 20% of the incident photons will be subject to two-photon effects at the focal plane as a result of which the photoresist will be exposed to light whose wavelength is half the wavelength of the illuminating source.

There will thus be two aerial images formed in two parallel, but separate, planes in the photoresist. One will be due to the original illuminating wavelength and will include all the distortions resulting from proximity effects, while the other will be due to radiation generated through two-photon absorption. Because it is half the wavelength, the latter will be largely free of proximity effects and will have a lower CD. Once the photoresist is developed, only the shorter wavelength image will survive because of the selective wavelength sensitivity of the photoresist that was specified earlier. Typically, the CD when the original (single photon) radiation is used would be between about 0.2 and 0.4 microns whereas when the process of the present invention is used (assuming a similar pattern and illuminating radiation) the CD is less by a factor of between about 1.5 and 2 times.

It should also be noted that the probability of frequency doubling falls off very rapidly as we move away from the focal plane (as the fourth power of the distance from the focal plane) so that only a very thin layer of the photoresist will be exposed during a single scan of the pulsed source. It is therefore advisable to expose the photoresist more than once with the focal plane set to be at a different level within the photo-resist layer each time. In this way exposure of the full layer thickness is assured. Note that this does not preclude the use of standard approaches for improving the depth of focus such as off-axis illumination, scatter bars, and photoresist process control.

Figure 2:
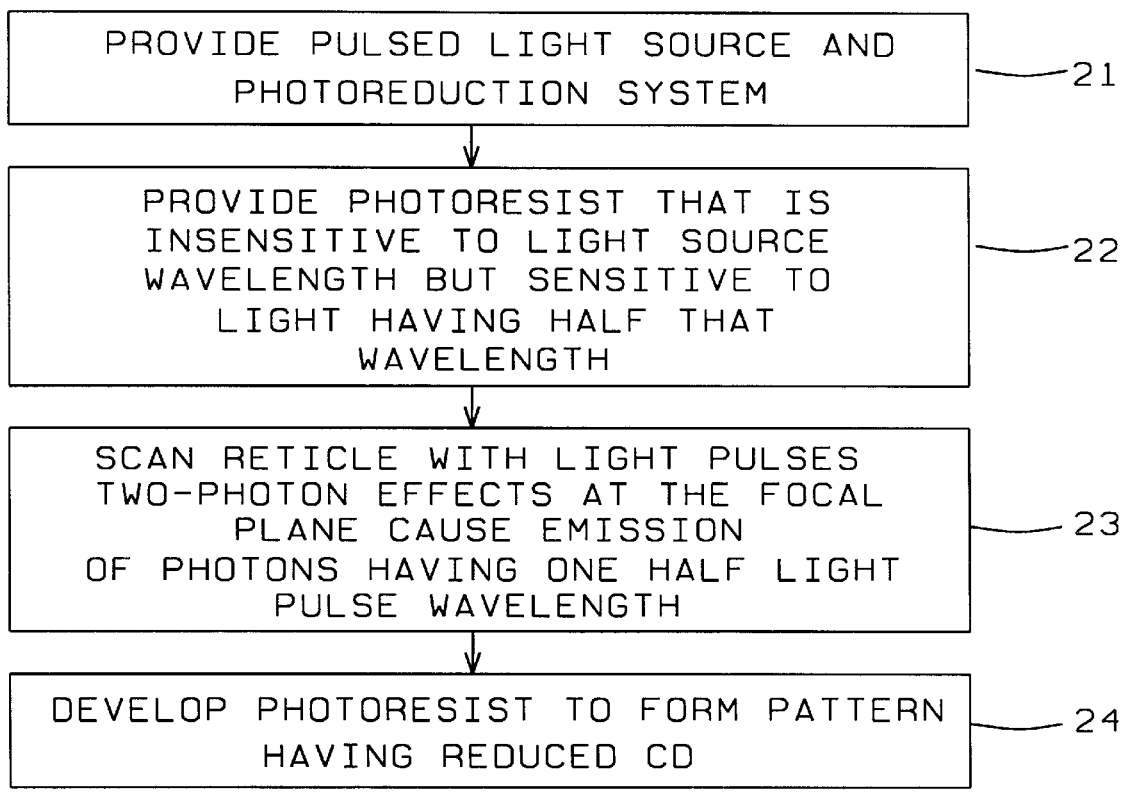
FIG. 2 is a flow chart summarizing the process of the present invention.

Schematic visual representation of the invention can be found in FIG. 1 where a train of light pulses 11 illuminates condenser lens 13 by scan 12 of reticle 14. An image of 14 is focused by projection lens 15 on focal plane 17 which lies within photoresist layer 16. Through the two-photon effect, photons 18, having half the wavelength of light source 11, are generated at the focal plane. The process of the invention is summarized in flow chart form in FIG. 2. Steps 21 and 22 prepare the system, in step 23 the short wavelength photons are formed, while in step 24 the final product is obtained.

While the invention has been particularly shown and described with reference to the preferred embodiments thereof, it will be understood by those skilled in the art that various changes in form and details may be made without departing from the spirit and scope of the invention.

What is claimed is:

1. A process for improving resolution during photolithography, comprising:

providing a light source having a first wavelength;

providing a photoreduction system having a focal plane and a reticle bearing a pattern whose image in said focal plane has a first CD;

providing a layer of photoresist that is insensitive to light of said first wavelength and sensitive to light of a second wavelength that is one half said first wavelength;

disposing the layer of photoresist so that the focal plane is parallel to, and wholly within, the layer;

causing the light source to emit a series of pulses and then illuminating the reticle by scanning it with said light pulses whereby two-photon effects at the focal plane cause the photoresist to be exposed to light of the second wavelength; and developing the photoresist layer thereby forming a photoresist image of the pattern having a second CD that is between about ½ and ⅔ times said first CD.

2. The process described in claim 1 wherein each pulse has a width that is no greater than about 0.2 picoseconds.

3. The process described in claim 1 wherein each pulse has a power level of no less than about 5 watts.

4. The process described in claim 1 wherein the pulses have a repetition rate of between about $10^3$ and $10^8$ pulses per second.

5. The process described in claim 1 wherein the pulses have an average power level that is no greater than about 50 watts.

6. The process described in claim 1 wherein the first wavelength is between about 248 and 365 nm.

7. The process described in claim 1 wherein the first CD is between about 0.2 and 0.4 microns.

8. The process described in claim 1 wherein the step of causing the light source to emit a series of light pulses further comprises Q-switching wherein a shutter in time mode is used to control pulses or a saturation absorber is used wherein an aperture selectively passes single mode pulses while blocking multi-mode pulses.

9. The process described in claim 1 further comprising exposing the photoresist layer at least twice, the focal plane being in a different location for each such exposure.

10. A photoreduction system for photolithography, comprising:

a light source having a first wavelength;

a focal plane and a reticle bearing a pattern whose image in said focal plane, formed using said first wavelength, has a first CD;

a layer of photoresist that is insensitive to light of said first wavelength and sensitive to light of a second wavelength that is one half said first wavelength;

the layer of photoresist being disposed so that the focal plane is parallel to, and wholly within, the layer;

means for causing the light source to emit a series of pulses; and means for illuminating the reticle by scanning it with said light pulses whereby two-photon effects at the focal plane cause the photoresist to be exposed to light having the second wavelength, thereby forming a photoresist image of the pattern having a second CD that is between about ½ and ⅔ times the first CD.

11. The photoreduction system described in claim 10 wherein each pulse has a width that is no greater than about 0.2 picoseconds.

12. The photoreduction system described in claim 10 wherein each pulse has a power level of no less than about 5 watts.

13. The photoreduction system described in claim 10 wherein the pulses have a repetition rate of between about $10^3$ and $10^8$ pulses per second.

14. The photoreduction system described in claim 10 wherein the pulses have an average power level that is no greater than about 50 watts.

15. The photoreduction system described in claim 10 wherein the first wavelength is between about 248 and 365 nm.

16. The photoreduction system described in claim 10 wherein the first CD is between about 0.2 and 0.4 microns.

17. The photoreduction system described in claim 10 herein said means for causing the light source to emit a series of pulses further comprises Q-switching wherein a shutter in time mode is used to control pulses or a saturation absorber is used wherein an aperture selectively passes single mode pulses while blocking multi-mode pulses.

* * * * *